US006204518B1

(12) United States Patent
Adan et al.

(10) Patent No.: US 6,204,518 B1
(45) Date of Patent: Mar. 20, 2001

(54) SRAM CELL AND ITS FABRICATION PROCESS

(75) Inventors: Albert O. Adan, Ikoma; Jun Koyama, Atsugi; Shunpei Yamazaki, Tokyo, all of (JP)

(73) Assignees: Sharp Kabushiki Kaisha, Osaka; Semiconductor Energy Laboratory Co., Ltd., Kanagwa, both of (JP)

( * ) Notice: Subject to any disclaimer, the term of this patent is extended or adjusted under 35 U.S.C. 154(b) by 0 days.

(21) Appl. No.: 09/487,258

(22) Filed: Jan. 19, 2000

(30) Foreign Application Priority Data

Jan. 19, 1999 (JP) .................................................. 11-011124

(51) Int. Cl.[7] .......................... H01L 29/76; H01L 31/036; H01L 31/112; H01L 27/01; H01L 27/12
(52) U.S. Cl. .............................. 257/67; 257/57; 257/350; 257/393; 257/903
(58) Field of Search ............................... 257/57, 67, 350, 257/393, 903

(56) References Cited

U.S. PATENT DOCUMENTS 5,852,310 * 12/1998 Kadosh et al. ..................... 257/67
5,949,092 * 9/1999 Kadosh et al. ..................... 257/67
5,952,678 * 9/1999 Ashida ................................ 257/67

FOREIGN PATENT DOCUMENTS 2-143414   6/1990   (JP) .
8-288515   11/1996  (JP) .

OTHER PUBLICATIONS

Oda et al., "Solid Phase Growth of Si Using the U–LPCVD Method", Preprint of the 38th Physics–related Engineers Association in Spring of 1991, Mar. 28, 1991, 31p–X–12, p. 742.

* cited by examiner

Primary Examiner—Ngân V. Ngô
(74) Attorney, Agent, or Firm—Nixon & Vanderhye, P.C.

(57) ABSTRACT

An SRAM cell comprising, at least, two driving transistors and two transfer transistors, and two load transistors each comprised of a TFT and disposed on these transistors through a layer insulation film, the load transistors having an active region comprising an Si film having improved crystallizability of amorphous Si by the solid phase growth technique using a catalytic element, and a barrier layer for preventing the catalytic element from diffusion into the driving transistors and the transfer transistors which is disposed between the layer insulation film and the load transistors.

8 Claims, 7 Drawing Sheets

SRAM CELL AND ITS FABRICATION PROCESS

CROSS-REFERENCE TO RELATED APPLICATION

This application is related to Japanese application No. HEI11(1999)-111524 filed on Jan. 19, 1999, whose priority is claimed under 35 USC § 119, the disclosure of which is incorporated by reference in its entirety.

BACKGROUND OF THE INVENTION

1. Field of the Invention

The present invention relates to an SRAM (static random access memory) cell and its fabrication process. More particularly, the invention relates to an SRAM cell constituted in such a manner that a load device is a thin film transistor and that the SRAM cell is of a three-dimensional structure and high in integration density and operates at a low voltage, and also to its fabrication process.

2. Description of the Related Art

An SRAM cell is constituted from two inverters and two transfer transistors, wherein the two inverters are cross-connected and connected to bit lines by the two transfer transistors. The inverter is normally constituted from an NMOS driving transistor and a load device and applied with a supply voltage.

Figure 4A:
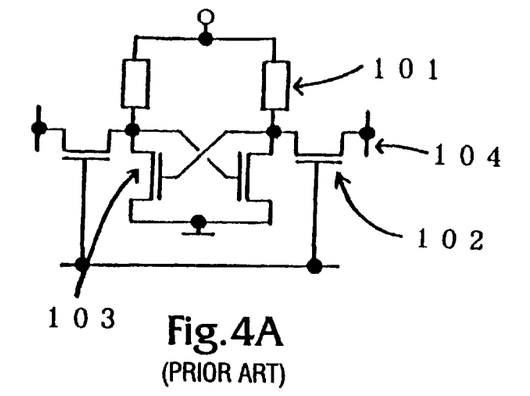
FIG. 4A to FIG. 4C show circuit arrangements of typical SRAM cells.
Figure 4B:
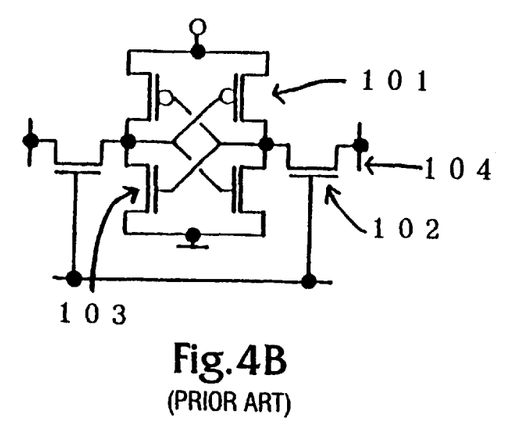
Figure 4C:
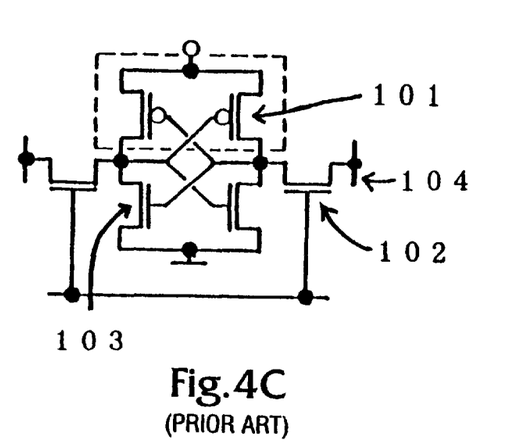

FIG. 4A to FIG. 4C show typical SRAM cell structures. In FIG. 4A to FIG. 4C, three kinds of SRAM cells are shown; these SRAM cells differ in respect of the constitution and kind of a load device. Namely, in case of the SRAM cell shown in FIG. 4A, a resistor composed of PolySi is used as a load device 101; in case of FIG. 4B, a transistor (called as a bulk transistor) formed on a substrate is used as the load device 101; and in case of FIG. 4C, a transistor (called as a stacked transistor) formed on a driving transistor 103 is used as the load device 101. Of these SRAM cells, the SRAM cells shown in FIG. 4B and FIG. 4C are called as a full CMOS type SRAM cell, particularly, the SRAM cell shown in FIG. 4B is called as a bulk full CMOS type SRAM cell. Referring to FIG. 4A to FIG. 4C, reference numerals 102 and 104 denote a transfer transistor and a bit line, respectively.

In the above-described constitutions, in order to attain a higher integration density of the SRAM cell, the load devices 101 shown in FIGS. 4A and C are desirably a resistor composed of PolySi or a stacked transistor. This is because the load device 101 can be formed on the driving transistor 103 formed on the substrate, so that the element area can be reduced.

Figure 5A:
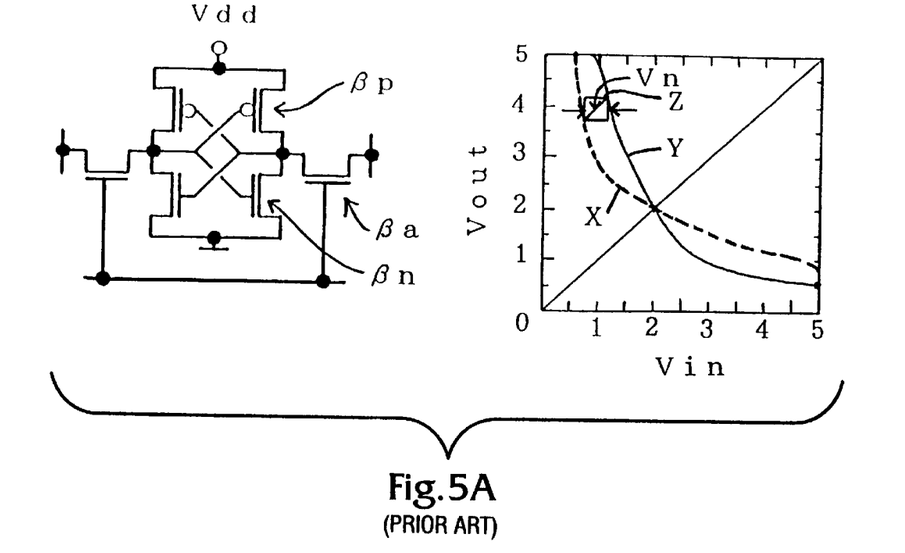
FIG. 5A and FIG. 5B are diagrams showing the state of the SRAM cell and a relation between βp and SNM.
Figure 5B:
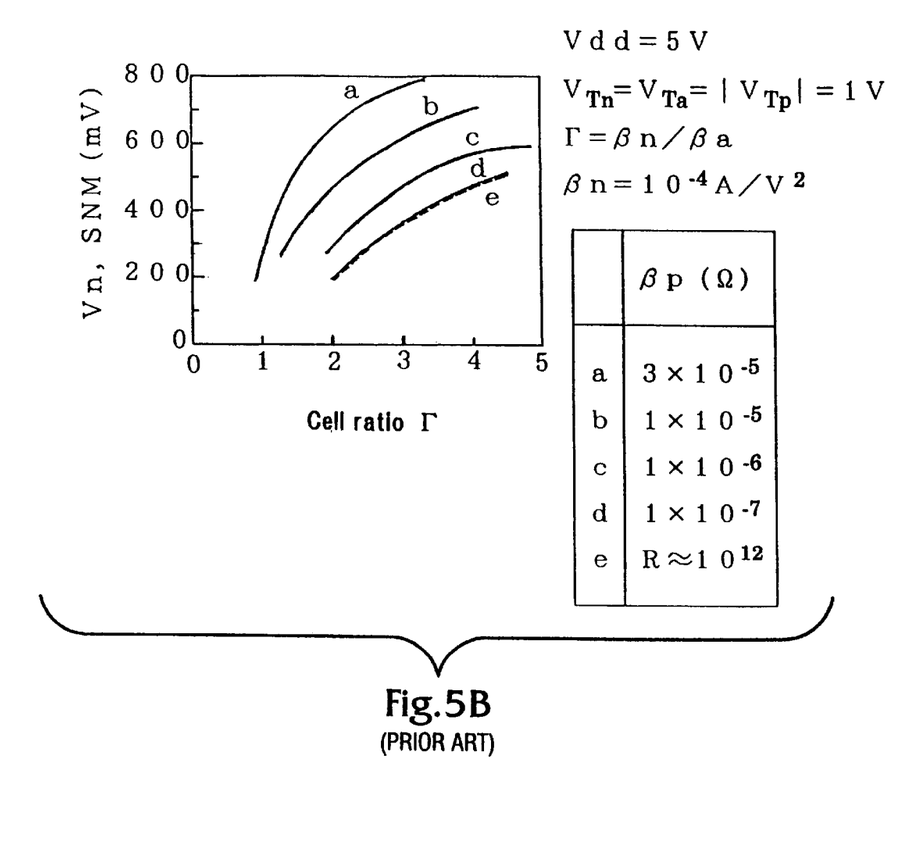

On the other hand, in view of driving the SRAM cell, the following is desired. In order to enhance the stability of the SRAM cell and drive it at a low voltage, the load device is required to be driven by a high current. FIG. 5A is a diagram showing the state of an SRAM cell. The robustness of the memory cell against unbalance, device mismatches and noise from power source and adjacent cells is characterized by the static noise margin: SNM. Graphically, the SNM is given by the side Vn=SNM of the maximum diagonal square Z formed between the transfer curves (X and Y) of both cell inverters. Further, FIG. 5B shows a relation between the load device transconductance $\beta p$ and SNM. In FIG. 5B, it is shown that the higher the $\beta p$, the larger the SNM; and accordingly, a higher margin can be obtained.

Here, in case of the bulk full CMOS type SRAM cell shown in FIG. 4B, the $\beta p$ of the load device 101 is usually so high as about $3 \times 10^{-5}$ A/V$^2$. On the other hand, the $\beta p$ of the load device 101 shown in FIG. 4C is usually about $1 \times 10^{-7}$ A/V$^2$, so that in case that the supply voltage is 1 V or lower, it is difficult to make the bulk full CMOS type SRAM cell sufficiently operate. Further, in case of the bulk full CMOS type SRAM cell shown in FIG. 4B, the limit of the ON-state current of the load device 101 is 50 $\mu$A, but in case of the load device 101 shown in FIG. 4C, the limit of the ON-state current is 1 to 10 $\mu$A, and therefore, the cell can be used only at a high supply voltage.

Figure 6:
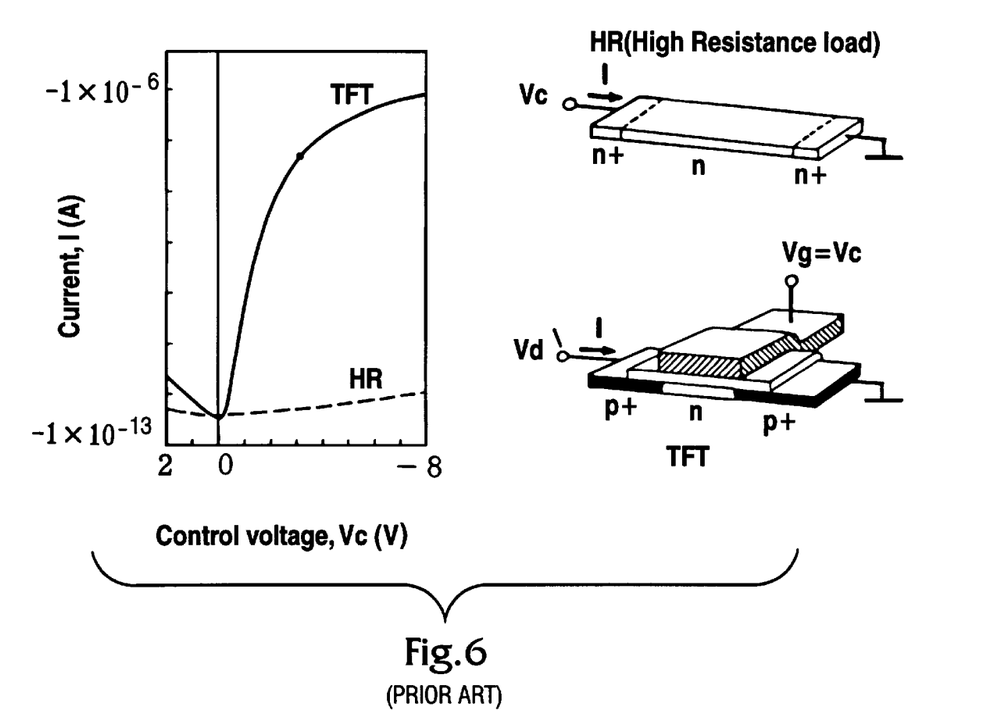
FIG. 6 shows diagrams explaining I–V characteristics of a load device.

Further, FIG. 6 shows I–V characteristics of the load devices shown in FIGS. 4A and C. As is apparent from this FIG. 6, in case that a PMOS formed on the driving transistor is used as the load device, the cell can drive a large current and operate at a lower voltage.

Thus, in order that the cell operates stably in a high integration density and with a low voltage (1 V or lower), it is desired to use a load device composed of a stacked transistor at a driving current substantially the same as in a load device composed of a bulk transistor. For this reason, it is desired to improve the mobility of the stacked transistor.

In a stacked transistor, usually a PolySi film is used in an active region. For this reason, in order to improve a mobility of this transistor, it is required to increase the grain size (grain diameter) of a crystal constituting the PolySi film. As a method of increasing the grain size, there is known a method according to which a PolySi film is solid phase grown epitaxially from an amorphous Si film, for example by subjecting the film to a heat treatment at about 600° C. for about 30 hours or laser annealing.

However, the quality of the PolySi film obtained by this method is not sufficient for use in an SRAM cell. The reason for this, in case of this method, grain boundaries are scattered, so that the mobility is decreased, and at the same time, the characteristics of the SRAM cell are scattering. Further, since a long time and a high temperature are employed, the characteristics of the transistor formed on the substrate underneath the stacked transistor are deteriorated, this being also a problem.

As means for solving such problems, the following methods are exemplified.

Figure 7:
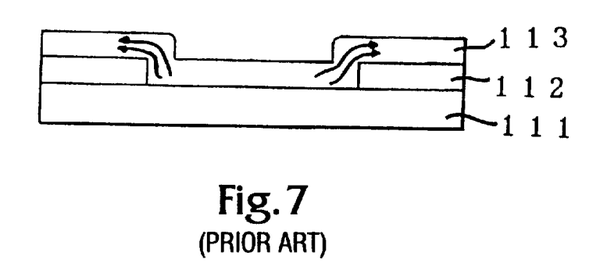
FIG. 7 is a schematic diagram for explaining a known solid phase growth technique for PolySi films.

As shown in FIG. 7, a portion of an insulation film 112 formed on a substrate 111 is bored to form an opening, and then, an amorphous Si film 113 is deposited and heat-treated, whereby a PolySi film is solid phase grown, with single crystal Si of the opening acting as a nucleus (Nobuhiko Oda, et al., *Preprint of the 38th Physics-Related Engineers Association in Spring of 1991*, page 742 31p-X-12, "Solid Phase Growth of Si Using the U-LPCVD Method"). In FIG. 7, arrows indicate a direction of the solid phase growth.

Figure 8:
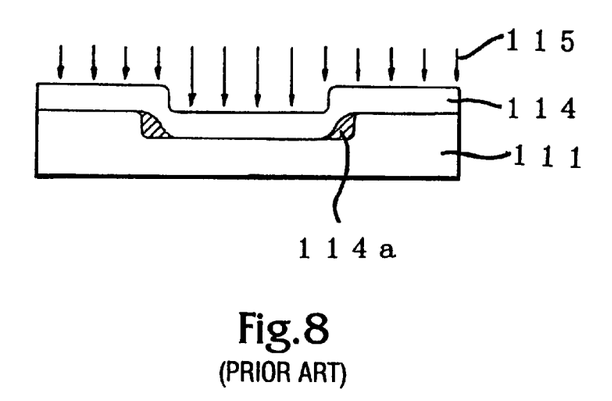
FIG. 8 is a schematic diagram for explaining a known solid phase growth technique for PolySi films.

As shown in FIG. 8, after a PolySi film 114 is deposited on a substrate 111 having a stepped portion, an Si ion 115 is implanted into the entire surface, to about the same thickness as in the PolySi film. By the Si ion implantation, the PolySi film 114 is converted into an amorphous state. But, since no Si ion is implanted into a PolySi film 114a existing in the side walls of the stepped portion, the PolySi film 114a remains in its polycrystalline state. Subsequently, by performing heat treatment, the PolySi film is solid phase grown, with the PolySi film 114a of the side walls acting as a nucleus (see Japanese Unexamined Patent Publication No. HEI 2(1990)-143414).

Figure 9:
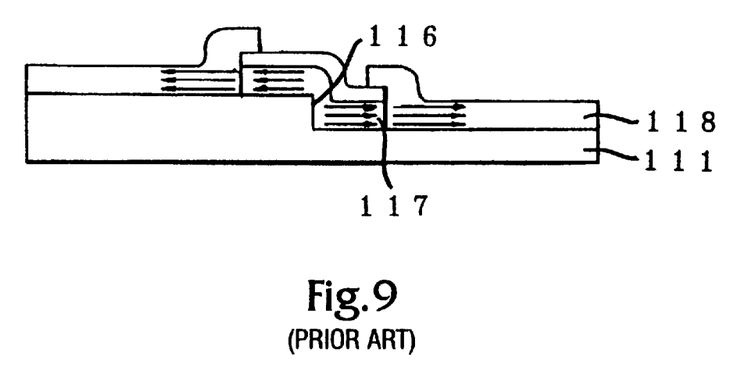
FIG. 9 is a schematic diagram for explaining a known solid phase growth technique for a PolySi film.

As shown in FIG. 9, after depositing an amorphous Si film on the substrate 111 having a stepped portion 116, heat treatment is carried out to form an Si film 117 containing somewhat large polycrystals near the stepped portion. Next, the Si film portion, excepting the Si film existing near the stepped portion, which does not contain somewhat large polycrystals, is removed. Then, an amorphous Si film 118 is deposited over the entire surface, and heat treatment is carried out, whereby, with the somewhat large polycrystals acting as nuclei, a PolySi film having large grain boundaries is solid phase grown (see Japanese Unexamined Patent Publication No. HEI 8(1997)-288515). In FIG. 9, arrows indicate directions of the solid phase growth.

Besides the above-described methods, there is also known a method of forming a PolySi film by utilizing the fact that a catalytic element helps polycrystallization of amorphous Si (Japanese Unexamined Patent Publication No. HEI 9(1997)-312404). According to this method, first the catalytic element is contacted with a specific region of an amorphous Si film, and then, heat treatment is carried out, whereby, with the catalytic element acting as a nucleus, a PolySi film is solid phase grown. Next, by oxidizing the thus obtained PolySi film in an oxidizing atmosphere containing a halogen, an oxide film is formed on the PolySi film, and at the same time, the oxide film is subjected to gettering of the catalytic element. After this, by removing the oxide film, a PolySi film having high crystallizability is obtained. According to this method, a PolySi film can be obtained relatively easily, and the PolySi film thus obtained has a mobility of 200 cm$^2$/V or higher.

The above-described methods have the following problems.

In case of the method shown in FIG. 7, since crystallization proceeds also from the vicinity of the side walls of the opening, the direction of the crystal of the PolySi film formed is not fixed. Further, tin case of the method shown in FIG. 8, the interface between the ion-implanted amorphous film and the PolySi film of the side walls is not clear and accurate since the concentration of ions implanted varies in the interface. For this reason, it is difficult to obtain a PolySi film with a uniform crystal direction.

In case of the method shown in FIG. 9, photolithography must be performed at least twice at the step of forming the stepped portion and at the step of leaving the PolySi film existing near the stepped portion; and thus, there arises a problem that the manufacturing time is long.

In case of the method using a catalytic element, the catalytic element used reacts with Si to form a silicide, whereby there is fear that the transistors formed on the substrate are contaminated. Further, a plug is used for connecting the transistors formed on the substrate to the stacked transistors each other. This plug needs to be formed directly beneath the stacked transistors in view of enhancing the integration density. However, in case that this method is used, the plug acts as a nucleus, as a result of which an undesirable crystal comes to be contained in the active region.

SUMMARY OF THE INVENTION

Thus, according to this invention, there is provided an SRAM cell comprising, at least, two driving transistors and two transfer transistors, and two load transistors each comprised of a TFT and disposed on these transistors through a layer insulation film, the load transistors having an active region comprising an Si film having improved crystallizability of amorphous Si by the solid phase growth technique using a catalytic element, and a barrier layer for preventing the catalytic element from diffusion into the driving transistors and the transfer transistors which is disposed between the layer insulation film and the load transistors.

Further, according to this invention, there is provided a fabricating process of an SRAM cell, which comprises covering two driving transistors and two transfer transistors with a layer insulation film; forming on the layer insulation film a barrier layer for preventing a catalytic element from diffusion into the driving transistors and the transfer transistors; forming an amorphous Si film on the barrier layer; forming an Si film having improved crystallizability of amorphous Si by the solid growth technique using the catalytic element; forming an active region by patterning the Si film to a desired shape; and stacking a gate insulation film and a gate electrode on the active region in this order to form a load transistor.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

First, two driving transistors and two transfer transistors are covered with a layer insulation film.

The structures of the driving transistors and the transfer transistors are not particularly limited; any of known structures can be used. For example, there are enumerated a transistor in which source/drain regions are provided on a surface layer of a semiconductor substrate such as an Si substrate or a GaAs substrate, and a gate electrode is provided on a channel region between the source/drain regions; and a transistor in which an Si film to be used as source/drain/channel regions and a gate electrode are provided on an insulating substrate. Here, the driving transistors and the transfer transistors may be of either a P- or N-conductivity type.

Further, around each individual transistor, an element isolation region may be formed by the LOCOS method, the impurity implantation method or the like.

The layer insulation film covering the driving transistors and the transfer transistors may comprise an Si oxide film, an Si nitride film, a PSG film or a BPSG film, or a film formed by stacking these films. A thickness of the layer insulation film varies depending on the material used, but usually is from 300 to 1,200 nm. The method of forming the layer insulation film is not particularly limited, but the CVD method, the thermal oxidation method, etc. are employable.

Further, as for the layer insulation film, its surface is more desirably planarized in order to improve crystallizability of an amorphous Si film formed on the layer insulation film through a barrier layer. As the planarizing method, any known method can be employed; for example, the CMP method (chemical mechanical polishing method) is enumerated.

Next, on the layer insulation film, a barrier layer is formed for preventing a catalytic element from diffusion into the driving transistors and the transfer transistors. Examples of the material constituting this barrier layer include $Al_2O_3$, $Si_xN_y$, and $TiO_2$. Further, a thickness of the barrier layer usually is from 20 to 100 nm though it varies depending on the material used. As the method of forming the barrier layer, the sputtering method and the CVD method are employable.

Subsequently, an amorphous Si film is formed on the barrier layer. A thickness of the amorphous Si film is usually from 30 to 60 nm though it varies depending on the material used. The method of forming the amorphous film is not particularly limited; any known method can be used. For example, the LPCVD method in which a silane-based compound such as silane ($SiH_4$) or disilane ($Si_2H_6$) is used as a raw material gas is employable.

Further, by the solid phase growth technique using a catalytic element, an Si film having improved crystallizability of the amorphous Si film is formed. This Si film having improved crystallizability is composed of or composed mainly of PolySi. Particularly, it is preferred that this Si film is a PolySi film in view of more improvements in the mobility.

The solid phase growth technique using a catalytic element is described below.

This technique comprises a step of contacting the catalytic element with the amorphous Si film, a step of effecting crystal growth by heat treatment, and a step of gettering of the catalytic element by heat treatment.

First, as the catalytic element which can be used at the contacting step, any catalytic element which can improve the crystallizability of Si can be used. Specific Examples include iron, cobalt, nickel, ruthenium, rhodium, palladium, osmium, iridium, platinum, copper, and gold.

As the method of contacting the catalytic element with the amorphous Si film, there can be used any of the method of applying a solution containing the catalytic element, the CVD method, the sputtering method, the vapor deposition method, the plasma treatment method and the gas adsorption method. Here, the method of applying a solution is superior in respect of the adjustment of the amount of the solution supplied and the reproducibility. As the solution containing a catalytic element, for example a solution obtained by dissolving a compound of the catalytic element in a solvent can be used. Further, after the application, it is preferred that the solvent is removed by a means such as the spin-drying method.

After the catalytic element is contacted, heat treatment is carried out, whereby the catalytic element is diffused into the amorphous Si film and becomes a nucleus for growing Si crystals. With this nucleus acting as a center, the step of solid phase growth of Si crystals proceeds in a desired direction of the amorphous Si film; for example, in case that the catalytic element is contacted with a surface of the amorphous Si film, the solid phase growth of Si crystals proceeds in the vertical direction of the film, while in case that the catalytic element is contacted with a side face of the amorphous Si film, the solid phase growth of Si crystals proceeds in the horizontal direction of the film.

As a desirable condition for the heat treatment is that the temperature is 500 to 600° C., and the treating time is 1 to 6 hours. In case that the temperature is lower than 500° C., or the time is shorter than 1 hour, the solid phase growth becomes insufficient, and therefore, this is not desirable. On the other hand, in case that the temperature is higher than 600° C., or th time is longer than 6 hours, it is not desirable since a flocculation phenomenon takes place. Further, it is preferred that the heat treatment is carried out in an inert gas atmosphere.

Desirably, the catalytic element is adjusted so as to remain on the order of $10^{18}$ $cm^{-3}$ in the Si film having improved crystallizability.

Next, by heat-treating the Si film, the catalytic element in the Si film is subjected to gettering. The heat treatment is carried out in, e.g., an oxidizing atmosphere containing a halogen element or in a non-oxidizing atmosphere after phosphorus is doped. Here, as the former atmosphere containing a halogen element, for example, an oxygen atmosphere containing HCl, HF, HBr, $Cl_2$, $F_2$, $Br_2$ or $CF_4$ can be employed. In this case, it is preferred that the condition for the heat treatment is such a condition that an oxide film having a thickness of 20 nm is formed at 800° C. Further, as the latter non-oxidizing atmosphere, an atmosphere of an inert gas such as nitrogen is employable. In this case, further, as a condition for the heat treatment, there is employed the condition that the heat treatment is carried out at a temperature on the order of from about 500 to 650° C. More specifically, in case that the temperature is 550° C., it is preferred that the heat treatment is carried out over several hours.

Here, by the former heat treatment, the catalytic element is subjected to gettering in an oxide film formed on the Si film. On the other hand, in case of the latter heat treatment, the catalytic element is subjected to gettering in the region in which phosphorus is implanted.

As the solid phase growth technique, the technique disclosed in Japanese Unexamined Patent Publication No. HEI 9(1997)-107100, Japanese Unexamined Patent Publication No. HEI 9(1997)-312402, or Japanese Unexamined Patent Publication No. HEI 9(1997)-312404 can be utilized.

Next, by patterning the Si film into a desired shape, an active region is formed. In case that the gettering of the catalytic element is effected in an oxidizing atmosphere containing a halogen element, the oxide film formed on the Si film is removed, and then, the patterning of the Si film is carried out. On the other hand, in case that the gettering is effected in a non-oxidizing atmosphere after phosphorus is doped, the patterning is carried out so that the region in which phosphorus is doped may be included in the region to be removed. As for the patterning method, there is no particular limitation; any of known methods can be used.

Subsequently, a gate insulation film and a gate electrode are formed in this order on the active region, whereby each load transistor is formed. As for the gate insulation film and the gate electrode, there is no particular limitation; they can be formed of known materials by known methods. Further, the active region includes the source/drain regions, but these regions may be formed before the formation of the gate electrode, or may be formed, after the formation of the gate electrode, by the use of the gate electrode as a mask. It is preferred that the load transistors are be of the P-conductivity type in case that the driving transistors and the transfer transistorize are of the N-conductive type, and of the N-conductivity type in case that the driving transistors and the transfer transistors are of the P-conductive type, respectively.

Further, in order to electrically connect the active region of the load transistors to the driving transistors and the transfer transistors, a throughhole may be formed through those regions of the driving transistors and the transfer transistors which are desired to be connected and through the active region, and then, the throughhole may be filled up with a wiring material to form a plug. In this case, the active region of the load transistor comes to be contacted, at its side walls, with the plug.

As the material for constituting the plug, PolySi and a refractory metal (such as tungsten or titanium) can be used. In case that PolySi is used, it is preferred that the formation of the plug is carried out after improving the crystallizability of the amorphous Si film. This is because if the plug is formed before the improvement of the crystallizability, a portion in which the amorphous Si film and the plug are contacted with each other becomes a nucleus, so that crystal wills grow in the amorphous Si film from this portion. Of the materials for constituting the plug, it is desirable to use a refractory metal. The reason for this is that in case that PolySi is used, if, for example, the N-type drain region of NMOS as the driving transistor and the P-type drain region of PMOS as the load transistor are connected to each other, then a PN junction is resulted, functioning as a parasitic diode to decrease the operating margin of the SRAM cell, and further, it is made difficult to implant into the portion beneath the plug an impurity for improving the conductivity of the PolySi. In contrast, in case that a refractory metal is used, the generation of a parasitic diode can be prevented.

Further, by forming the plug before the formation of the source/drain regions, the electrical connection between the plug and the active region can be more ensured by the heat treatment performed when the source/drain regions are formed.

Figure 1A:
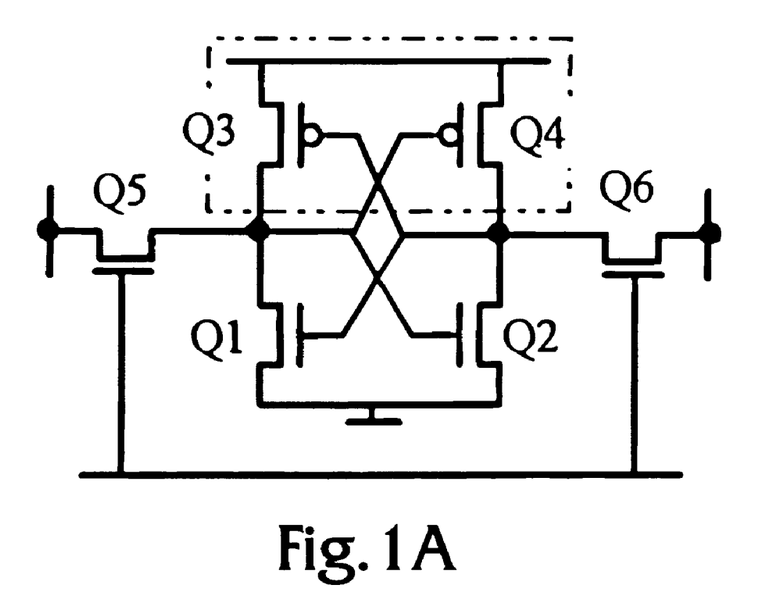
FIG. 1A and FIG. 1B are a diagram showing a circuit arrangement and a schematic sectional view of the SRAM cell according to this invention, respectively.
Figure 1B:
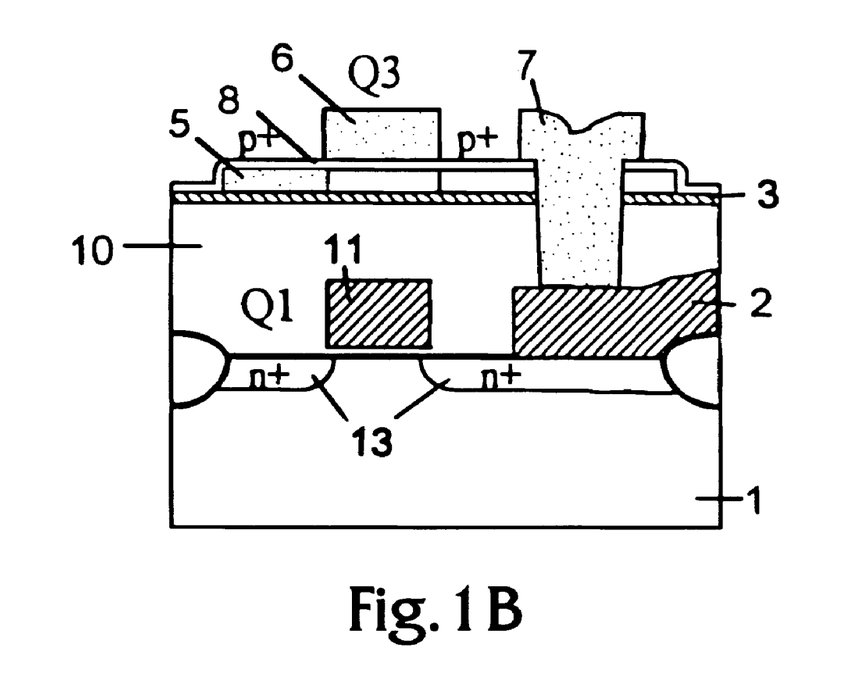

FIG. 1A and FIG. 1B show a circuit arrangement of the SRAM cell formed by the above-described manufacturing steps and a characteristic schematic sectional view. Referring to FIG. 1A, Q1 and Q2 denote driving transistors; Q3 and Q4 denote load transistors; and Q5 and Q6 denote transfer transistors, respectively. Further, referring to FIG. 1B, a reference numeral 1 denotes a substrate; a reference numeral 2 denotes a wiring layer which is contacted with source/drain regions 13 (a drain region in FIG. 1B) and constitutes a gate electrode of the adjacent transistors; a reference numeral 3 denotes a barrier layer; a reference numeral 5 denotes an active region; a reference numeral 6 denotes a gate electrode of the load transistor Q3; a reference numeral 7 denotes a plug; a reference numeral 8 denotes a gate insulation film; a reference numeral 10 denotes a layer insulation film; and a reference numeral 11 denotes a gate electrode of the driving transistor Q1, respectively. The structure shown in FIG. 1B is merely an exemplary on which may be altered.

Referring to the SRAM structure of FIG. 1B, the drain of transistor Q3 (PMOS), which is P-type, must be connected with the drain of transistor Q1, making a contact to the wiring layer 2 as illustrated. The wiring layer 2, which is the gate electrode of transistor Q2 in FIG. 1A, is of N-type conductivity. Therefore, for instance, if we directly connect Q3 drain with Q1 drain by using the same layer 5, which is P-type, a P-N diode junction is formed. This will result in a high value non-linear resistor between Q1 and Q3 drains and a degradation of the SRAM cell operating margin. Hence, a metal layer needs to be used to interconnect the P-type and N-type PolySi layers or short out the P-N diode junction.

Embodiment 1:

The process of fabricating the SRAM cell is further described on the basis of FIG. 2A to FIG. 2F.

First, on a substrate 1 composed of Si, NMOS transistors (the driving transistors and the transfer transistors) were fabricated by the ordinary CMOS fabricating technique. A gate electrode 11 composed of PolySi is a gate electrode of the NMOS transistor. Further, a wiring layer 2 composed of PolySi was formed by direct contact to the drain region of the NMOS transistor and so as to be used as a gate electrode of the adjacent NMOS transistor. After source/drain regions 13 of the NMOS transistor were formed, a layer insulation film 10 composed of an oxide film was deposited in a thickness of 1200 nm by the CVD method and planarized by the CMP method. The thickness of the oxide film 10 after planarization was 800 nm. After the planarization, a barrier layer 3 composed of alumina ($Al_2O_3$) was deposited by sputtering in a thickness of 50 nm (see FIG. 2A).

Next, by the use of a silane gas as a raw material, an amorphous Si layer 4 was formed in a thickness of 70 nm on the barrier layer 3 in an atmosphere under 500° C. by the LPCVD method. After this, the amorphous Si layer 4 was subjected to the solid phase growth technique. Namely, a solution containing a catalytic element was applied onto the amorphous Si layer 4 (see FIG. 2B). In FIG. 2B, a reference numeral 20 denotes a coating film containing a catalytic element. This coating film 20 was spin-dried to remove the solvent and then heat treated at 600° C. for 8 hours. By this heat treatment, the catalytic element was diffused into the amorphous Si layer 4 to constitute a silicide, whereby a solid phase growth having the silicide as a nucleus proceeded in the vertical direction of the amorphous Si layer 4. As a result, the crystallizability of the amorphous Si layer 4 could be improved. Further, the concentration of the catalytic element contained in the resulting Si film 4a having improved crystallizability was on the order of $10^{18}$ cm$^{-3}$ after the heat treatment.

Next, in order to remove the excess catalytic element in the Si film 4a, the gettering effect of phosphorous was utilized. Namely, an oxide film 21 was deposited on the Si film 4a by the CVD method, and then, by photolithography, the oxide film 21 was removed, while leaving a portion of the oxide film 21 covering the active region in a desired shape. By the use of the thus left oxide film 21 as a mask, phosphorus ions $^{31}P^+$ 22 were implanted into the Si film 4a under the condition that the implantation energy was 10 keV and that the dose was $2 \times 10^{15}$ cm$^{-2}$ (see FIG. 2C). Further, this implantation was also made into the area surrounding the SRAM cell array in order to avoid the occurrence of disturbance and perturbation to the active region. After the implantation, heat treatment was carried out in a nitrogen atmosphere at 600° C. for 12 hours. By this heat treatment, the catalytic element could be moved into the phosphorous-implanted region.

The phosphorus-implanted region containing a large amount of the catalytic element was removed, and at the same time, an active region 5 was formed by patterning. Then, a gate insulation film 8 composed of an Si oxide film in a thickness of about 10 nm was formed so as to cover the active region 5 (see FIG. 2D). In this case, in order to enhance the film quality of the gate insulation film 8 and improve the electrical characteristics of the active region 5, lamp annealing was carried out at 1000° C. for 15 seconds.

Subsequently, by the use of a resist mask 30, a throughhole 31 was bored for connecting the wiring layer 2 and the active region 5 to each other (see FIG. 2E). The opening of the throughhole 31 was formed at a position which, in the source/drain regions and the channel region to be formed later in the active region 5, was separated from the channel region and included at least a portion of the drain region.

After this, the resist mask 30 was removed, a TiN film (not shown) was deposited in a thickness of 50 nm over the entire surface, and subsequently, a film of tungsten as a refractory metal was deposited by the CVD method. Further, by patterning the tungsten film, a gate electrode 6 could be formed, and a plug 7 could also be formed in the throughhole 31. Then, using the gate electrode 6 as a mask, $^{49}BF_2^+$ was implanted into the active region 5, whereby the source/drain regions were formed in a self-alignment manner (see FIG. 2F).

After this, through an ordinary interconnection metallization process, an SRAM cell provided with PMOS transistors on the NMOS transistors formed on the substrate could be formed.

Figure 2A:
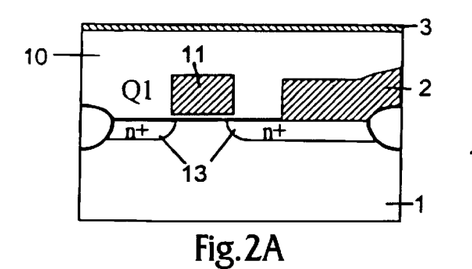
FIG. 2A to FIG. 2F are schematic sectional views, at the respective fabricating steps, of the SRAM cell according to this invention.
Figure 2B:
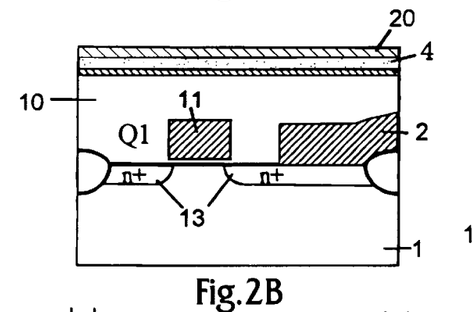
Figure 2C:
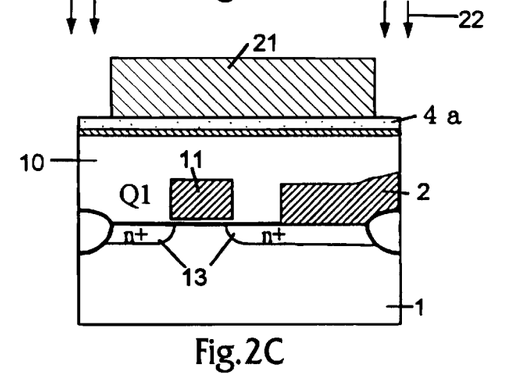
Figure 2D:
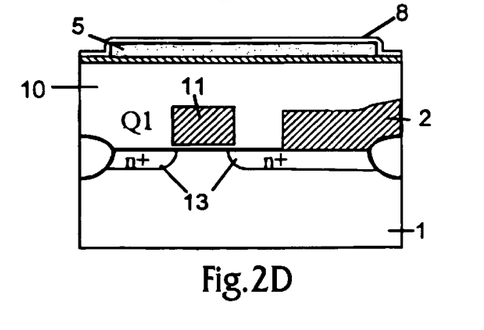
Figure 2E:
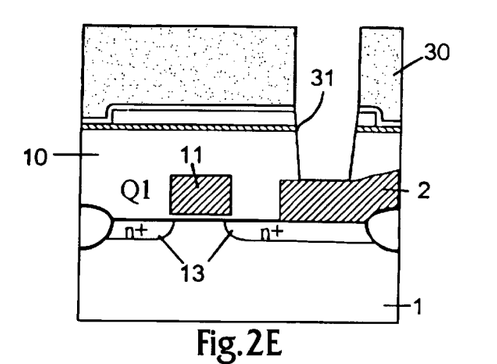
Figure 2F:
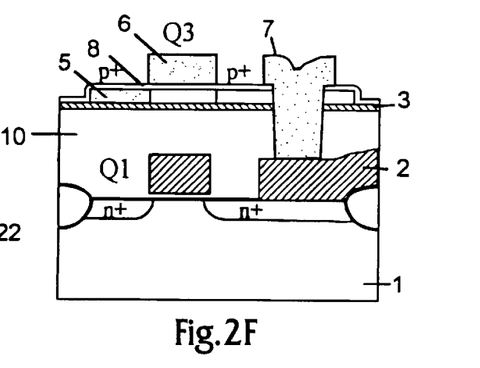

Embodiment 2:

After the barrier layer 3 was formed on the layer insulation film 10 in the same way as in case of FIG. 2A, an amorphous Si film 4 was formed in the same way as shown in FIG. 2B.

Figure 3A:
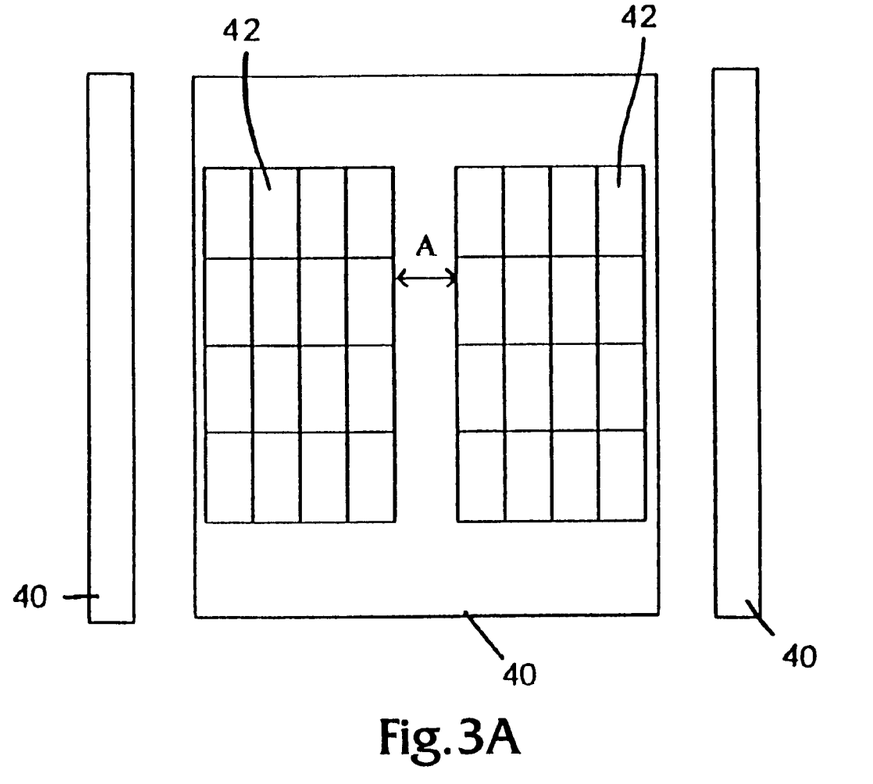
FIG. 3A and FIG. 3B are schematic diagrams show fabricating steps of the SRAM cell according to this invention.
Figure 3B:
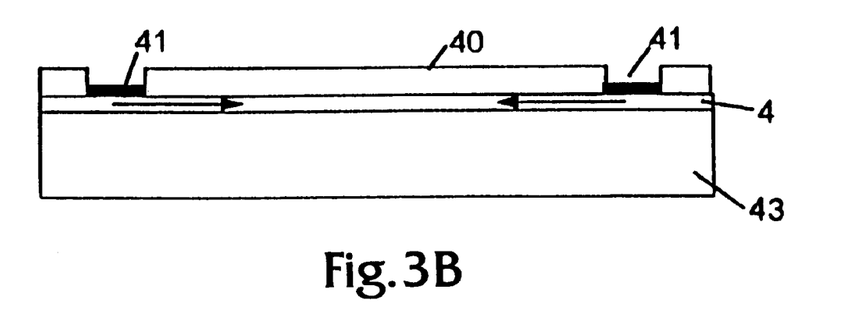

Next, using a mask 40 composed of Si oxide and formed by the CVD method as shown in FIG. 3A, a solution containing a catalytic element was applied onto the amorphous Si film 4. By using this mask 40, a coating film 41 could be formed between the portions of the mask 40 as shown in FIG. 3B. In FIG. 3B, a numeral reference 43 denotes a substrate having the structure having the barrier 3 and the other regions formed beneath it.

Next, heat treatment was carried out at 600° C. for 8 hours, whereby the catalytic element in the coating film was diffused into the amorphous Si film 4 to constitute a silicide; and the solid phase growth was proceeded in the lateral direction of the amorphous Si layer 4, whereby the crystallizability could be improved.

Here, as shown in FIG. 3B, the improvement in crystallizability of the amorphous Si film proceeds toward the center from the both sides, so that the treatment of the crystal grain boundaries formed in the center portion becomes a problem. Concerning this, by ensuring that the crystal grain boundaries were present in a portion A between two SRAM cell array forming regions 42 (in other words, by ensuring that the active region was not formed in the region in which the crystal grain boundaries were formed) as shown in FIG. 3A, the Si film containing the crystal grain boundaries is removed when the SRAM cell is formed.

After this, the SRAM cell could be formed by the same steps as shown in FIG. 2C to FIG. 2F has the following advantages:

The SRAM cell according to this invention has the following advantages:

(1) It is of a high integration density since the load transistors are formed on the driving transistors and the transfer transistors;

(2) It allows the formation of load transistors having a high mobility and a high driving current in a low driving voltage operation, since the load transistors have an active region comprising an Si film having improved crystallizability of the amorphous Si by the solid phase growth technique using a catalytic element; and (3) It can prevent the catalytic element diffuses into the driving transistors and the transfer transistors, since a barrier layer is provided between the driving transistors and the load transistors, and between the transfer transistors and the load transistors.

Further, after the formation of the active region of the load transistors, a throughhole is bored for connecting the driving transistors and the transfer transistors to the load transistors, and the throughhole is filled up with a refractory metal, whereby the solid phase growth technique can be used without being adversely affected.

What is claimed is:

1. An SRAM cell comprising, at least two driving transistors and at least two transfer transistors, and at least two load transistors each comprised of a TFT and disposed on the driving and transfer transistors through a layer insulation film, the load transistors having an active region comprising an Si film having improved crystallizability of amorphous Si by the solid phase growth technique using a catalytic element, and a barrier layer for preventing the catalytic element from diffusion into the driving transistors and the transfer transistors which is disposed between the layer insulation film and the load transistors.

2. The cell according to claim 1, wherein the barrier layer is comprised of $Al_2O_3$, $Si_xN_y$, or $TiO_2$.

3. The cell according to claim 1, wherein the load transistors are connected to the driving transistors and the transfer transistor by a plug provided with a throughhole formed in the active region of the load transistors and the layer insulation film, and the active region of the load transistors and the plug are contacted with each other on the side surface of the throughhole.

4. The cell according to claim 3, wherein the plug is composed of the same metal material as that of gate electrodes of the load transistors.

5. The cell according to claim 4, wherein the metal material comprises a refractory metal.

6. The cell according to claim 1, wherein the load transistors are formed on the layer insulation film whose surface is planarized by the CMP technique.

7. The cell according to claim 1, wherein the catalytic element is iron, cobalt, nickel, ruthenium, rhodium, palladium, osmium, iridium, platinum, copper, or gold.

8. The cell according to claim 1, wherein the Si film is a PolySi film.

* * * * *